(12) United States Patent
Sakakibara

(10) Patent No.: US 11,355,411 B2
(45) Date of Patent: Jun. 7, 2022

(54) HEAT SINK AND ASSEMBLY METHOD FOR HEAT SINK

(71) Applicant: NEC Platforms, Ltd., Kawasaki (JP)

(72) Inventor: Naoki Sakakibara, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/965,351

(22) PCT Filed: Feb. 4, 2019

(86) PCT No.: PCT/JP2019/003821
§ 371 (c)(1),
(2) Date: Jul. 28, 2020

(87) PCT Pub. No.: WO2019/156018
PCT Pub. Date: Aug. 15, 2019

(65) Prior Publication Data
US 2021/0125892 A1      Apr. 29, 2021

(30) Foreign Application Priority Data
Feb. 7, 2018   (JP) .............................. JP2018-020533

(51) Int. Cl.
*H05K 7/20* (2006.01)
*H01L 23/367* (2006.01)

(52) U.S. Cl.
CPC ..... *H01L 23/3672* (2013.01); *H05K 7/20445* (2013.01); *H05K 7/2039* (2013.01); *H05K 7/20509* (2013.01)

(58) Field of Classification Search
CPC ................ H01L 23/3672–3675; H05K 1/0203

USPC ......................................... 361/709–710, 719
See application file for complete search history.

(56) References Cited

U.S. PATENT DOCUMENTS

| | | | |
|---|---|---|---|
| 6,373,701 B1 * | 4/2002 | Lo ..................... | H01L 23/3672 165/185 |
| 6,702,007 B1 * | 3/2004 | Pan .................... | H01L 23/36 165/185 |
| 6,758,263 B2 * | 7/2004 | Krassowski ........... | F28F 13/00 165/185 |
| 6,977,814 B2 * | 12/2005 | Hornung ............... | H01L 23/367 165/185 |

(Continued)

FOREIGN PATENT DOCUMENTS

| JP | H08-288437 A | 11/1996 |
|---|---|---|
| JP | H10-21357 A | 1/1998 |

(Continued)

OTHER PUBLICATIONS

International Search Report for PCT Application No. PCT/JP2019/003821, dated Apr. 9, 2019.

*Primary Examiner* — Zachary Pape
(74) *Attorney, Agent, or Firm* — Sughrue Mion, PLLC

(57) ABSTRACT

A heat sink including a heat sink body having a heat-absorbing surface that absorbs heat transferred from a heat-generating body, and a heat-dissipating surface that externally radiates the heat; a holding member that is held against the heat-absorbing surface; and a fixation portion that is provided on the heat sink body, that fixes the holding member so as to be incapable of coming loose from the heat sink body, and that suppresses displacement in a planar direction in which the heat-absorbing surface extends.

5 Claims, 5 Drawing Sheets

(56) References Cited

U.S. PATENT DOCUMENTS

| | | | |
|---|---|---|---|
| 7,219,721 B2* | 5/2007 | Miyazaki | H01L 23/367 165/185 |
| 7,636,241 B2* | 12/2009 | Liu | H01L 23/42 165/185 |
| 2006/0227508 A1* | 10/2006 | Hornung | H01L 23/467 361/703 |

FOREIGN PATENT DOCUMENTS

| JP | H10-209352 A | | 8/1998 | |
|---|---|---|---|---|
| JP | 2000269671 A | * | 9/2000 | ............ F28F 13/00 |
| JP | 2011-061157 A | | 3/2011 | |
| JP | 2011-222972 A | | 11/2011 | |
| JP | 2012-009498 A | | 1/2012 | |
| JP | 2014-229714 A | | 12/2014 | |
| JP | 2017-034111 A | | 2/2017 | |

* cited by examiner

HEAT SINK AND ASSEMBLY METHOD FOR HEAT SINK

This application is a National Stage Entry of PCT/JP2019/003821 filed on Feb. 4, 2019, which claims priority from Japanese Patent Application 2018-020533 filed on Feb. 7, 2018, the contents of all of which are incorporated herein by reference, in their entirety.

TECHNICAL FIELD

The present invention relates to a heat sink for externally dissipating heat generated in an electronic component, and an assembly method for a heat sink.

BACKGROUND ART

In recent years, higher-density integration has progressed in semiconductor integrated circuits such as ICs (integrated circuits) and LSIs (large-scale ICs) that are used in electronic devices. With the high integration of internal circuitry, power consumption is also increasing in comparison to the past. Furthermore, in proportion with the increase in power consumption, the amount of heat generated by internal resistance and the like in semiconductor integrated circuits is also increasing.

As heat generation rises, not only does the efficiency of circuit operation become lower, but it may also induce thermal runaway of electronic circuits and cause damage to circuit elements. Thus, it is crucial to provide a heat dissipating means in an integrated circuit that is a heat source. As such a heat dissipating means, a heat sink that is formed from a metallic member composed of aluminum or the like having a heat capacity greater than that of the electronic component that is the heat-generating body is known. The heat sink is adhered to the outer surface of an electronic component by means of a heat-conducting material such as thermal grease, thereby inducing heat dissipation from the electronic component.

As such heat sinks, those described, for example, in Patent Documents 1 and 2 below are known. Patent Document 1 describes a heat-dissipating structure having a metallic member that is a heat-absorbing member for absorbing heat from a heat source, and a heat-dissipating member molded integrally with the metallic member. Patent Document 2 describes an LED heat sink having a heat sink body that is a heat-dissipating member for dissipating heat, and a heat transfer plate that is a heat-absorbing member, molded to the heat sink body, for absorbing heat generated by a high-luminance LED.

CITATION LIST

Patent Literature

[Patent Document 1]
Japanese Unexamined Patent Application, First Publication No. 2014-229714
[Patent Document 2]
Japanese Unexamined Patent Application, First Publication No. 2011-61157

SUMMARY OF INVENTION

Problem to be Solved by the Invention

In the devices according to Patent Document 1 and Patent Document 2, there are differences between the coefficients of linear thermal expansion of the heat-absorbing member and the heat-dissipating member. Additionally, in the devices according to Patent Document 1 and Patent Document 2, the heat-dissipating member is merely fixed to the heat-absorbing member by the holding force at the time of molding. For this reason, if heated continually with long-term use, there is a possibility that misalignment or gaps between the heat-absorbing member and the heat-dissipating member may occur due to the differences in the coefficients of linear thermal expansion. If such misalignment or gaps occur, the desired heat dissipation performance cannot be obtained.

The present invention was made in order to solve the above-mentioned problem and has, as an objective thereof, to provide a heat sink that is able to provide good heat dissipation performance for a long period of time, and an assembly method for the heat sink.

Means for Solving the Problem

An objective of the present invention is to provide a heat sink that solves the above-mentioned problem, and an assembly method for the heat sink.

A heat sink according to an embodiment of the present invention includes: a heat sink body having a heat-absorbing surface that absorbs heat transferred from a heat-generating body, and a heat-dissipating surface that externally radiates the heat; a holding member that is held against the heat-absorbing surface; and a fixation portion that is provided on the heat sink body, that fixes the holding member so as to be incapable of coming loose from the heat sink body, and that suppresses displacement in a planar direction in which the heat-absorbing surface extends.

Advantageous Effects of Invention

According to the above-mentioned embodiment, good heat dissipation performance can be obtained for a long period of time.

DESCRIPTION OF EMBODIMENTS

Figure 1:
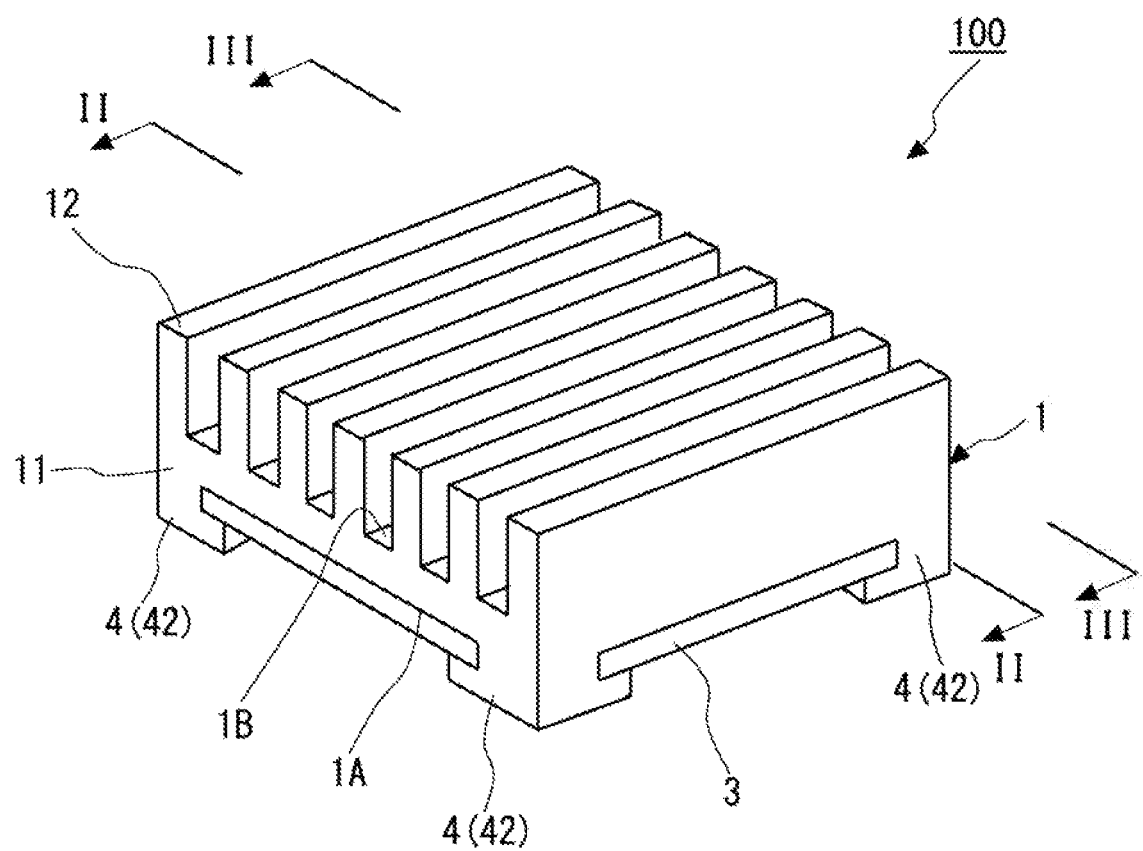
FIG. 1 is an exploded perspective view illustrating the structure of a heat sink according to an embodiment of the present invention.

An embodiment of the present invention will be explained with reference to the drawings.

The heat sink 100 according to the present embodiment is used by being disposed so as to be in tight contact with an electronic component including an integrated circuit element such as an LSI or an IC, thereby dissipating heat from the electronic component, which is a heat-generating body.

As illustrated in FIG. 1 to FIG. 4, the heat sink 100 is provided with a heat sink body 1, a holding member 3 and a fixation portion 4.

The heat sink body 1 has a rectangular plate-shaped base portion 11, and a plurality of fins 12 provided integrally on the base portion 11. The fins 12 are plate-shaped so as to extend in directions orthogonal to the plane in which the base portion 11 extends. The plurality of fins 12 are arrayed, so as to be spaced apart from each other, on one surface of the base portion 11. The fins 12 are not limited to being plate-shaped, and they may also be column-shaped.

In the present embodiment, the heat sink body 1 is formed from a thermally conductive resin. The heat sink body 1 is formed by being insert molded together with a fixation portion 4, using a thermally conductive resin as the material.

Of the surfaces of the base portion 11, the surface opposite to the surface on which the fins 12 are provided is a heat-absorbing surface 1A. The holding member 3 contacts the heat-absorbing surface 1A.

Of the surfaces of the base portion 11, the surface on which the fins 12 are provided is a heat-dissipating surface 1B. The plurality of fins 12 extend from the heat-dissipating surface 1B.

Figure 2:
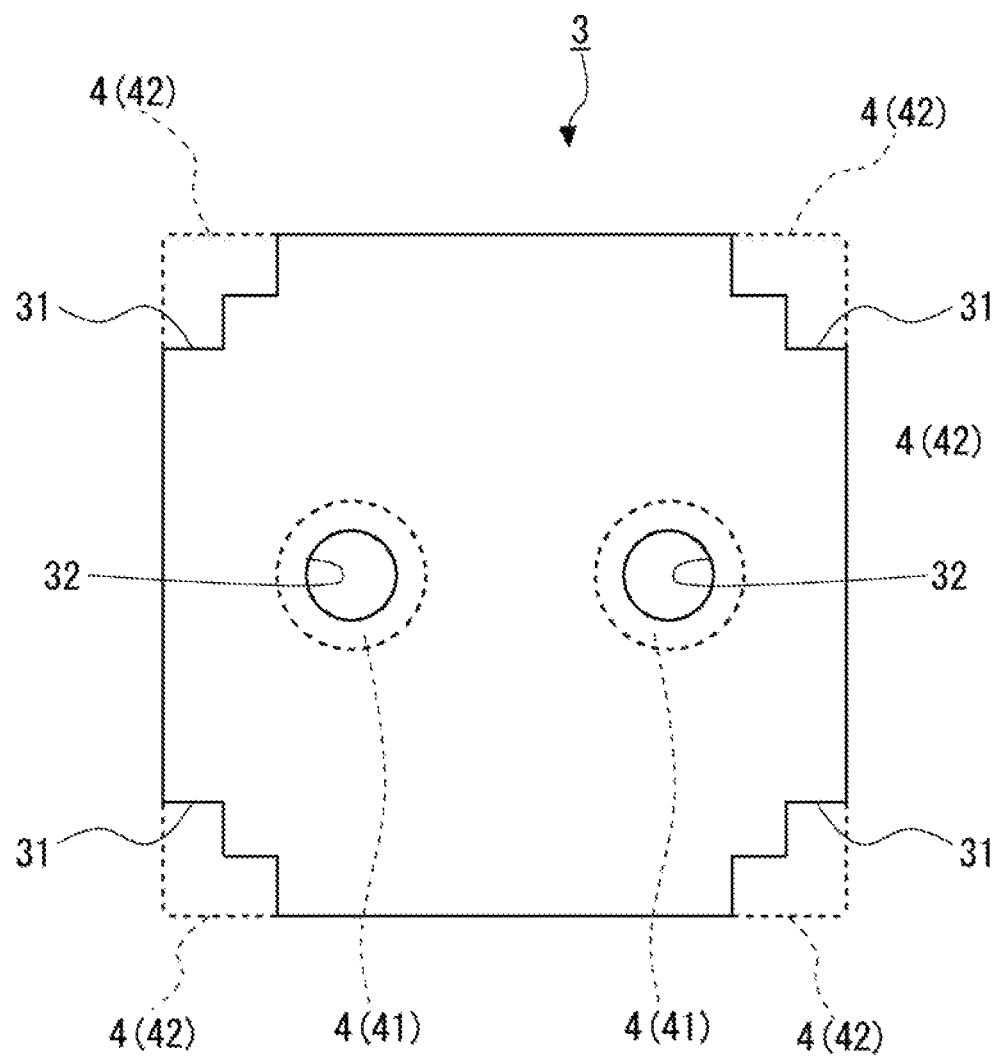
FIG. 2 is a plan view of a holding member according to an embodiment of the present invention.

As illustrated in FIG. 2, the holding member 3 is in the shape of a substantially rectangular plate.

The holding member 3 is held against the heat-absorbing surface 1A by the heat sink body 1.

In the present embodiment, the holding member 3 is formed from a metal (for example, aluminum).

Cutout portions 31 are formed at the four corners of the holding member 3. Each cutout portion 31 is formed so as to be L-shaped by being recessed inward from the edges of the holding member 3. A fixation portion 4 (second fixation portions 42), to be explained below, engages with these cutout portions 31. A plurality (two) through-holes 32 are formed in a central area of the holding member 3. Each through-hole 32 is a circular opening that penetrates through the holding member 3 in the thickness direction. A fixation portion 4 (first fixation portions 41), to be explained below, engages with these through-holes 32.

Figure 3:
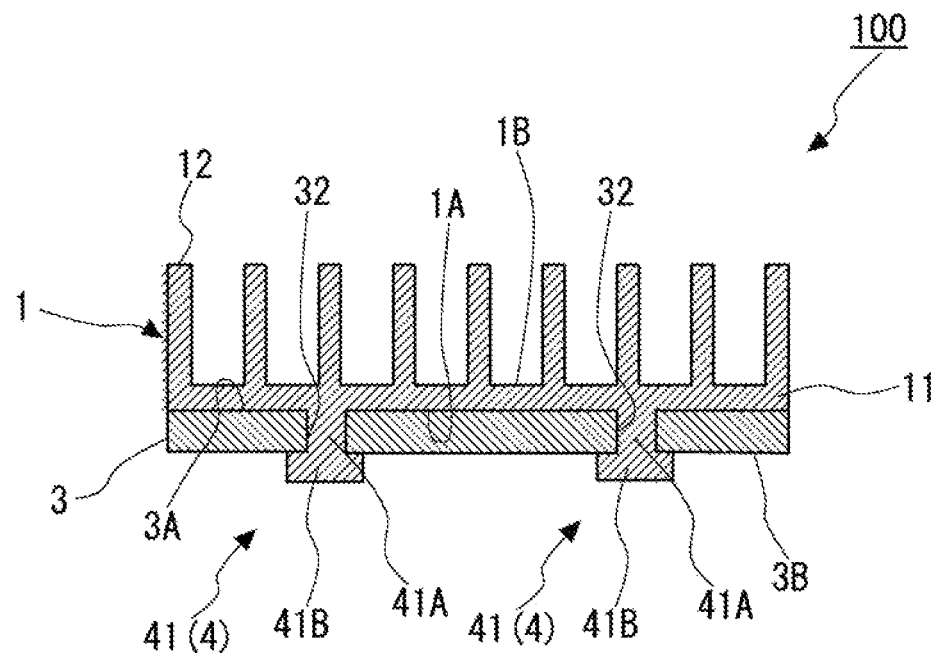
FIG. 3 is a section view along the line II-II in FIG. 1.
Figure 4:
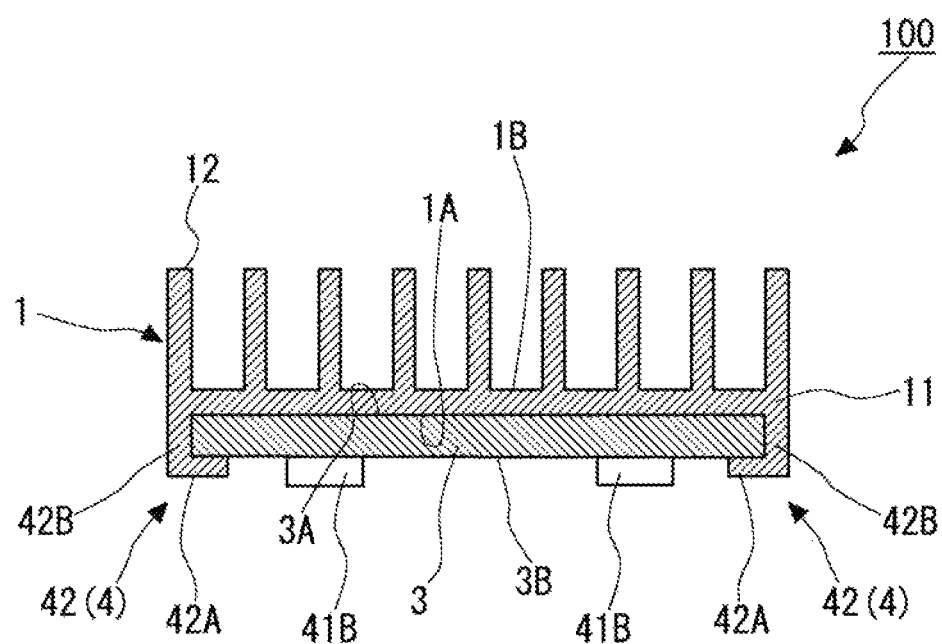
FIG. 4 is a section view along the line III-III in FIG. 1.

As illustrated in FIG. 3 or FIG. 4, of the surfaces of the holding member 3, the surface facing the heat-absorbing surface 1A is a contact surface 3A, and the surface facing in the direction opposite to the heat-absorbing surface 1A is a heat transfer surface 3B. As illustrated in FIG. 3, the heat-absorbing surface 1A of the heat sink body 1 is fixed so as to be in tight contact with the contact surface 3A of the holding member 3 by insert molding the heat sink body 1 to the holding member 3.

The holding member 3 is fixed to the heat sink body 1, by means of the fixation portion 4, so as to be incapable of coming loose. The structure of the fixation portion 4 will be explained. The fixation portion 4 has first fixation portions 41 and second fixation portions 42.

As illustrated in FIG. 3, the first fixation portions 41 each have an insertion portion 41A that protrudes from the base portion 11 (heat-absorbing surface 1A) of the heat sink body 1 towards the contact surface 3A of the holding member 3, and an engaging portion 41B that is provided integrally on the tip of the insertion portion 41A. The insertion portion 41A is inserted through a through-hole 32 formed in the holding member 3. The engaging portion 41B is formed in the shape of a flange that extends in a planar direction orthogonal to the direction in which the insertion portion 41A extends (that is, the planar direction in which the heat transfer surface 3B of the holding member 3 extends).

As illustrated in FIG. 3, in the present embodiment, the engaging portion 41B of the first fixation portion 41 extends from the through-hole 32 along the heat transfer surface 3B of the holding member 3 and contacts the heat transfer surface 3B in the periphery of the through-hole 32.

As illustrated in FIG. 4, the second fixation portions 42 each have a contact portion 42A that is provided on at least a portion of an edge of the heat-absorbing surface 1A (the four corners of the heat-absorbing surface 1A in the present embodiment), and a connection portion 42B that connects the contact portion 42A with the heat sink body 1 (base portion 11). The contact portion 42A extends along the heat transfer surface 3B of the holding member 3. The contact portion 42A contacts a part, including the edges, of the heat transfer surface 3B at a corner. The connection portion 42B is provided integrally with the contact portion 42A. As a result thereof, the second fixation portion 42 is formed so as to be substantially L-shaped in section view.

Due to these first fixation portions 41 and second fixation portions 42, the holding member 3 is fixed to the heat sink body 1. More specifically, the displacement of the holding member 3 in the planar direction in which the heat-absorbing surface 1A of the heat sink body 1 extends is suppressed by the first fixation portions 41 and the second fixation portions 42. In the present embodiment, an example of a structure provided with both first fixation portions 41 and second fixation portions 42 as the fixation portion 4 has been explained. However, the structure may be such as to be provided with only first fixation portions 41 or only second fixation portions 42 as the fixation portion 4.

Additionally, in the present embodiment, the cutout portions 31 and the second fixation portions 42 are provided at the four corners of the heat-absorbing surface 1A, but they may be provided at any position on an edge of the heat-absorbing surface 1A. As a modified example, the cutout portions 31 and the second fixation portions 42 may be provided on the four sides of the heat-absorbing surface 1A. Even in the case in which they are provided on the four sides of the heat-absorbing surface 1A, they have effects similar to those in the case in which they are provided at the four corners of the heat-absorbing surface 1A.

Figure 5:
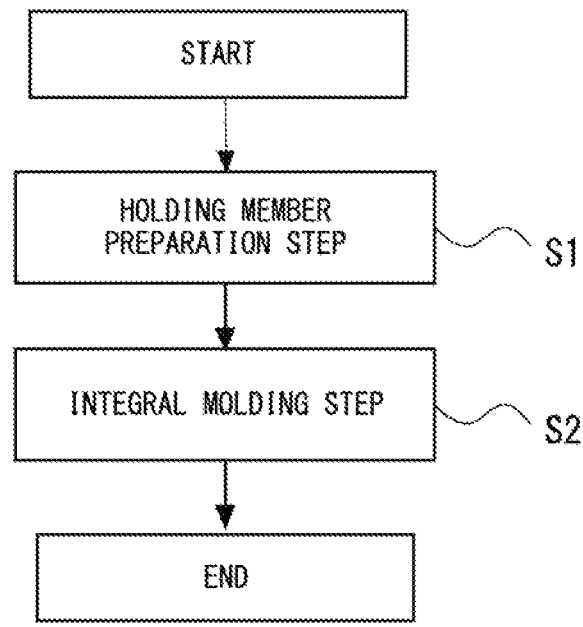
FIG. 5 is a procedural diagram indicating a heat sink assembly method according to an embodiment of the present invention.

Next, an assembly method of the heat sink 100 according to the present embodiment will be explained with reference to FIG. 5. As illustrated in FIG. 5, the assembly method of the heat sink 100 includes a holding member preparation step S1 and an integral molding step S2.

First, a holding member preparation step S1 is performed.

Figure 6:
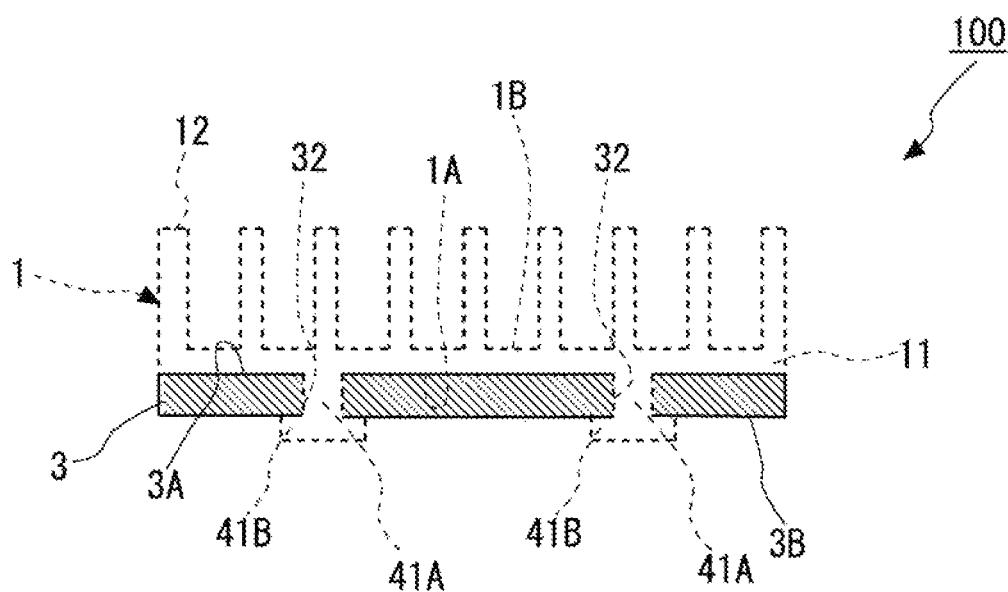
FIG. 6 is a section view illustrating a state after performing a holding member preparation step in the heat sink assembly method according to an embodiment of the present invention.

As illustrated in FIG. 6, the holding member preparation step S1 involves preparing a holding member 3 in which cutout portions 31 and through-holes 32 are formed.

Next, the integral molding step S2 is performed.

The integral molding step S2 involves setting the holding member 3 in which the cutout portions 31 and the through-holes 32 are formed inside a mold, and pouring a thermally conductive resin into the mold. By pouring the thermally conductive resin into the mold, the thermally conductive resin enters into the cutout portions 31 and the through-holes 32.

Figure 7:
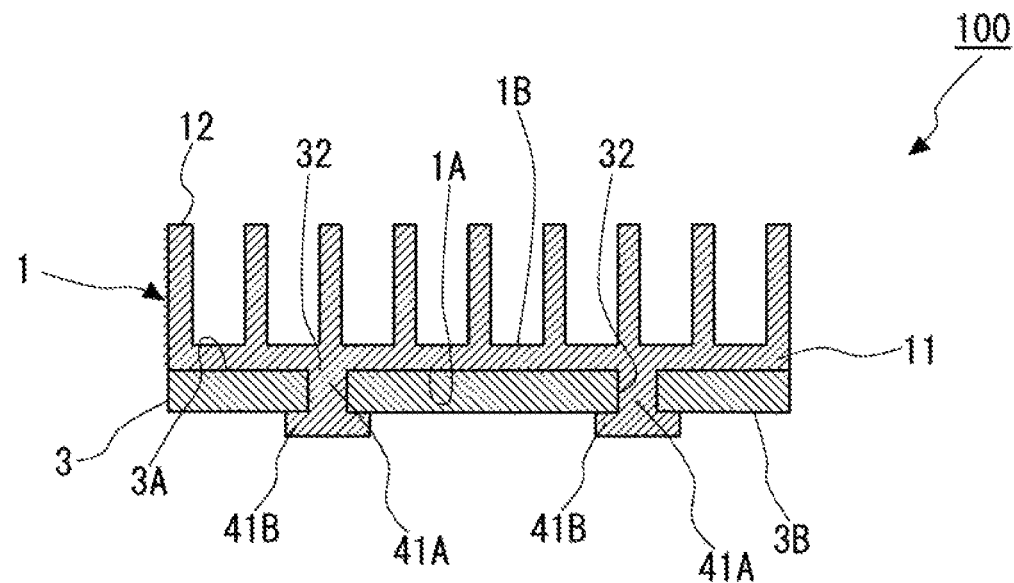
FIG. 7 is a section view illustrating a state after performing an integral molding step in the heat sink assembly method according to an embodiment of the present invention.

As a result thereof, the heat sink body 1 and the fixation portion 4 are integrally molded on the holding member 3, as illustrated in FIG. 7. Specifically, the first fixation portions 41, the second fixation portions 42, and the heat sink body 1 including the base portion 11 and the fins 12 are integrally molded with the holding member 3 by means of insert molding.

Additionally, as a result thereof, the heat sink body 1 and the fixation portion 4 can be made to come into tight contact with the holding member 3 based on the shapes thereof.

This completes all of the steps in the assembly procedure of the heat sink 100.

When using the heat sink 100, it is arranged to be in a state such that the heat transfer surface 3B of the holding member 3 is in contact with an integrated circuit element such as, for example, an LSI or an IC. It is also possible to provide thermal grease or the like between the heat transfer surface 3B and the surface of the integrated circuit element. When electricity is supplied to the integrated circuit element in this state, heat is generated by internal resistance and the like. The heat is absorbed by the holding member 3, is transferred through the holding member 3 to the heat sink body 1, and is externally dissipated through the fins 12 on the heat sink body 1. As a result thereof, the temperature of the integrated circuit element can be lowered and the element can be used for a long period of time.

When electricity is repeatedly supplied to and cut off from the circuit element for a long period of time, the heat sink 100 expands and contracts with the exchange of heat. More specifically, considerable expansion and contraction occurs between the above-mentioned heat sink body 1 and the holding member 3. When such expansion and contraction is repeated, there is a possibility that the tight contact of the heat sink body 1 with respect to the holding member 3 will not be able to withstand the stress associated with displacement, resulting in the holding member 3 and the heat sink body 1 separating or becoming misaligned.

However, with the heat sink 100 according to the present embodiment, the holding member 3 is fixed by means of the fixation portion 4 so as to be incapable of coming loose from the heat sink body 1. Furthermore, the fixation portion 4 suppresses displacement of the heat sink body 1 in the planar direction in which the heat-absorbing surface 1A extends. Specifically, the engaging portions 41B of the first fixation portions 41 suppress relative displacement in the central area of the holding member 3. Furthermore, the contact portions 42A of the second fixation portions 42 suppress relative displacement in the areas including the edges of the holding member 3. As a result thereof, when heat enters the heat sink 100, even if there is a difference between the coefficient of linear thermal expansion of the heat sink body 1 and the coefficient of linear thermal expansion of the holding member 3, the fixation portion 4 fixes the holding member 3 in opposition to the contraction or expansion. Therefore, it is possible to reduce the possibility that separation or misalignment will occur therebetween. As a result thereof, it becomes possible to provide good heat dissipation performance for a long period of time.

Furthermore, the heat sink 100 according to the present embodiment is provided with a plurality of first fixation portions 1 and a plurality of second fixation portions 42. Thus, the holding member 3 can be more firmly and stably fixed to the heat sink body 1.

Additionally, with the assembly method for the heat sink 100 according to the present embodiment, the heat sink body 1, the first fixation portions 41 and the second fixation portions 42 are formed on the holding member 3 by means of integral molding, thereby fixing the holding member 3 to the heat sink body 1. Therefore, the holding member 3 can be firmly fixed to the heat sink body 1.

An embodiment of the present invention has been explained above. It is possible to make various modifications and improvements to the above-mentioned structure and method as long as they do not depart form the spirit of the present invention. For example, in the above-mentioned embodiment, an example of the case in which an integrated circuit element is used as the heat generating body was explained. However, the heat sink 100 may be applied to any circuit element as long as it is an element requiring the dissipation of heat.

Figure 8:
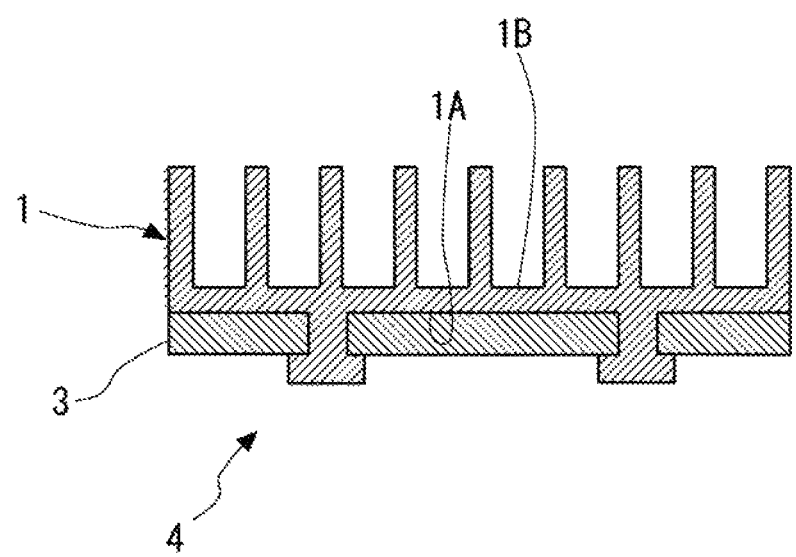
FIG. 8 is a section view illustrating the minimum structure of a heat sink according to an embodiment of the present invention.

FIG. 8 is a diagram illustrating the minimum structure of the heat sink 100. It is sufficient for the heat sink 100 to be provided with at least a heat sink body 1 having a heat-absorbing surface 1A and a heat-dissipating surface 1B, a holding member 3, and a fixation portion 4.

Priority is claimed on Japanese Patent Application No. 2018-020533, filed Feb. 7, 2018, the entire disclosure of which is incorporated herein by reference.

INDUSTRIAL APPLICABILITY

According to the embodiment described above, it is possible to obtain good heat dissipation performance for a long period of time.

REFERENCE SIGNS LIST

1 Heat sink body
3 Holding member
4 Fixation portion
11 Base portion
12 Fin
1A Heat-absorbing surface
1B Heat-dissipating surface
31 Cutout portion
32 Through-hole
3A Contact surface
3B Heat transfer surface
41 First fixation portion
41A Insertion portion
41B Engagement portion
42 Second fixation portion
42A Contact portion
42B Connection portion
S1 Holding member preparation step
S2 Integral molding step

What is claimed is:

1. A heat sink comprising:
   a heat sink body having a heat-absorbing surface that absorbs heat transferred from a heat-generating body, and a heat-dissipating surface that externally radiates the heat;
   a holding member that is held against the heat-absorbing surface and having cutout portions that recesses inward from each edge of the holding member; and
   a fixation portion that is provided on the heat sink body, that fixes the holding member so as to be incapable of coming loose from the heat sink body, and that suppresses displacement in a planar direction in which the heat-absorbing surface extends,
   wherein the fixation portion has a first fixation portion and a second fixation portion, the second fixation portion having a contact portion that is provided on a corner of the heat-absorbing surface on the heat sink body, engaging with the cutout portions at each corner of the heat-absorbing surface, and that contacts a heat transfer surface, on the holding member, facing a side opposite to the heat-absorbing surface, and a connection portion that connects the contact portion with the heat sink body.

2. The heat sink according to claim 1, wherein the first fixation portion of the fixation portion has an insertion portion that protrudes from the heat-absorbing surface towards the holding member and that is inserted through a through-hole formed in the holding member, and an engagement portion that is provided on the tip of the insertion portion and that engages with the through-hole.

3. The heat sink according to claim 2, wherein a plurality of the first fixation portions are arrayed so as to be spaced apart from each other.

4. The heat sink according to claim 1, wherein a plurality of the second fixation portions are arrayed so as to be spaced apart from each other along the edge of the heat-absorbing surface.

5. An assembly method for a heat sink including:
- a heat sink body having a heat-absorbing surface that absorbs heat transferred from a heat-generating body, and a heat-dissipating surface that externally radiates the heat;
- a holding member that is held against the heat-absorbing surface and having cutout portions that recess inward from each edge of the holding member; and
- a fixation portion that is provided on the heat sink body, that fixes the holding member so as to be incapable of coming loose from the heat sink body, and that suppresses displacement in a planar direction in which the heat-absorbing surface extends, wherein the fixation portion has a first fixation portion and a second fixation portion, the second fixation portion having a contact portion that is provided on a corner of the heat-absorbing surface on the heat sink body, engaging with the cutout portions at each corner of the heat-absorbing surface, and that contacts a heat transfer surface, on the holding member, facing a side opposite to the heat-absorbing surface, and a connection portion that connects the contact portion with the heat sink body, the assembly method comprising:

preparing the holding member; and molding integrally the heat sink body and the fixation portion with the holding member.

* * * * *